United States Patent [19]
Inomata et al.

[11] Patent Number: 5,672,459
[45] Date of Patent: Sep. 30, 1997

[54] RADIATION SENSITIVE RESIN COMPOSITION CONTAINING QUINONE DIAZIDE ESTER HAVING TWO HINDERED PHENOL GROUPS

[75] Inventors: Katsumi Inomata; Masahiro Akiyama, both of Yokkaichi; Toshiyuki Ota, Tsukuba; Akira Tsuji, Yokkaichi, all of Japan

[73] Assignee: Japan Synthetic Rubber Co., Ltd., Tokyo, Japan

[21] Appl. No.: 621,008

[22] Filed: Mar. 22, 1996

[30] Foreign Application Priority Data

Mar. 31, 1995 [JP] Japan .................... 7-075785

[51] Int. Cl.$^6$ ............................ G03F 7/023
[52] U.S. Cl. ................ 430/191; 430/192; 430/193
[58] Field of Search .................... 430/190, 191, 430/192, 193

[56] References Cited

U.S. PATENT DOCUMENTS

| | | | |
|---|---|---|---|
| 5,278,021 | 1/1994 | Jeffries, III | 430/165 |
| 5,290,658 | 3/1994 | Uenishi et al. | 430/193 |
| 5,306,596 | 4/1994 | Oie et al. | 430/193 |
| 5,478,692 | 12/1995 | Doi et al. | 430/193 |
| 5,532,107 | 7/1996 | Oie et al. | 430/193 |

FOREIGN PATENT DOCUMENTS

| | | |
|---|---|---|
| 0 395 049 | 10/1990 | European Pat. Off. . |
| 0 510 672 | 10/1992 | European Pat. Off. . |

OTHER PUBLICATIONS

Derwent WPI, Database Publications, AN–92–317641/39, JP–4–284454, Oct. 9, 1992.
Derwent WPI, Database Publications, AN–394165/48, JP–4–293050, Oct. 16, 1992.
Derwent WPI, Database Publications, AN–93–354204/45, JP–5–257274, Oct. 8, 1993.

*Primary Examiner*—Christopher G. Young
*Attorney, Agent, or Firm*—Oblon, Spivak, McClelland, Maier & Neustadt, P.C.

[57] ABSTRACT

The present invention provides a radiation sensitive resin composition which contains an alkali soluble resin and a 1,2-quinonediazide compound represented by the following formula, for example.

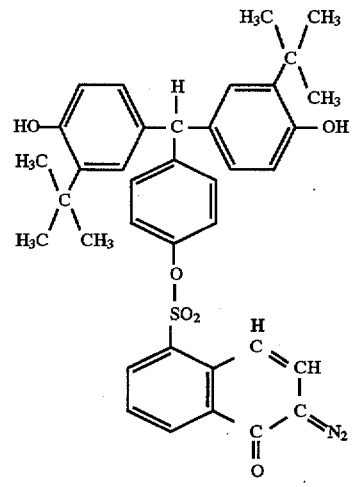

The radiation sensitive resin composition of the present invention has an excellent developability, provides an excellent pattern shape, is superior in sensitivity and resolution, and has greatly improved focus latitude and heat resistance in particular. Therefore, the radiation sensitive resin composition of the present invention can be suitably used as a resist for the production of LSIs.

18 Claims, 1 Drawing Sheet

(G)   (A)   (B)

RADIATION SENSITIVE RESIN COMPOSITION CONTAINING QUINONE DIAZIDE ESTER HAVING TWO HINDERED PHENOL GROUPS

BACKGROUND OF THE INVENTION

This invention relates to a radiation sensitive resin composition containing an alkali soluble resin. More specifically, it relates to a radiation sensitive resin composition which is sensitive to ultraviolet rays such as g-line, i-line and the like, far ultraviolet rays such as a KrF excimer laser beam and the like, X rays such as a synchrotron radiation and the like, various radiations such as charged particle beams including an electron beam, particularly to ultraviolet rays and far ultraviolet rays, and which is suitable for use as a resist for the production of LSIs.

DESCRIPTION OF THE PRIOR ART

Positive resists have been and are widely used in the production of ICs. With recent progress in the integration of ICs, however, positive resists by which resist patterns with improved resolution can be formed have been desired.

One of methods for improving resist materials to enhance the resolution of a positive resist is to reduce the molecular weight of an alkali soluble resin used in a resist, for example. However, this method involves the problem of a reduction in the heat resistance of a resist. Another method is to increase the numerical aperture of a stepper to enhance resolution through process improvement. Since this method has the problem of causing a narrowed depth of focus (focus latitude), it needs to improve resist materials at the same time. One of counter-measure means for improving focus latitude is to increase the amount of a quinonediazide compound added, for example. However, when the amount of the quinonediazide compound is increased, a developability deteriorates. Thus, when a certain property of a positive resist is improved, another property deteriorates. Therefore, a positive resist having high resolution, a good focus latitude, and a good developability for a fine pattern is in demand.

JP-A-4-284454 (the term "JP-A" as used herein means an "unexamined published Japanese patent application") discloses a positive resist composition which contains an alkali soluble resin and as a photosensitive agent a quinonediazide sulfonic acid ester of a compound represented by the following formula (5):

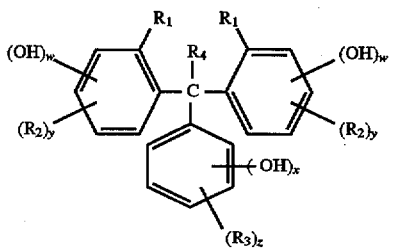

wherein $R_1$ and $R_2$ are each an alkyl group, an alkoxyl group, a carboxyl group or a halogen atom; $R_3$ is a hydrogen atom, an alkyl group, an alkoxyl group, a carboxyl group or a halogen atom; $R_4$ is a hydrogen atom, an alkyl group or an aryl group; and w to z are each an integer of 0 to 3, provided that w+x is 1 or more.

JP-A-4-293050 discloses a positive resist composition which contains an alkali soluble phenol resin and, as a photosensitive agent, a quinonediazide sulfonic acid ester of a compound represented by the following formula (6) or (7):

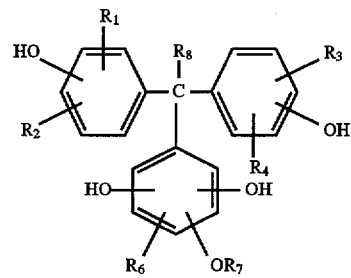

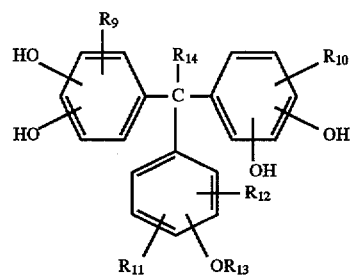

wherein $R_1$ to $R_6$ are the same or different and each is a hydrogen atom, a halogen atom, a hydroxyl group, a $C_1$~$C_4$ alkyl group, a $C_2$~$C_5$ alkenyl group or a $C_1$~$C_8$ alkoxyl group; $R_7$ is a $C_1$~$C_8$ alkyl group; $R_8$ is a hydrogen atom, a $C_1$~$C_4$ alkyl group, a $C_2$~$C_5$ alkenyl group or a $C_6$~$C_{15}$ aryl group; $R_9$ and $R_{10}$ are the same or different and each is a hydrogen atom, a halogen atom, a hydroxyl group, a $C_1$~$C_4$ alkyl group, a $C_2$~$C_5$ alkenyl group, a $C_1$~$C_8$ alkoxyl group or acyl group; $R_{11}$ and $R_{12}$ are the same or different and each is a hydrogen atom, a halogen atom, a $C_1$~$C_4$ alkyl group, a $C_2$~$C_5$ alkenyl group or a $C_1$~$C_8$ alkoxyl group; $R_{13}$ is a $C_1$~$C_8$ alkyl group; and $R_{14}$ is a hydrogen atom, a $C_1$~$C_4$ alkyl group, a $C_2$~$C_5$ alkenyl group or a $C_6$~$C_{15}$ aryl group.

JP-A-5-257274 discloses a positive resist composition which contains an alkali soluble resin and a quinonediazide-based photosensitive agent which contains a quinonediazide sulfonic acid monoester of a phenol compound represented by the following formula (8):

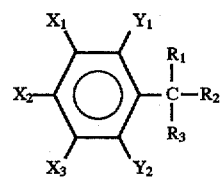

wherein $R_1$ to $R_3$ are each a hydrogen atom, an alkyl group or an aryl group which may be substituted, provided that at least one of $R_1$ to $R_3$ is an alkyl group or an aryl group which may be substituted; $X_1$ to $X_3$ are each a hydrogen atom, an alkyl group or an —OH group, provided that at least one of $X_1$ to $X_3$ is an —OH group; $Y_1$ and $Y_2$ are independently a hydrogen atom, an alkyl group or an —OH group, provided that at least two phenolic —OH groups are contained in the molecule, and in which the content of the quinonediazide sulfonic acid monoester is at least 10% by weight of the whole quinone diazide-based photosensitive agent.

However, all of the above three publications fail to disclose a quinonediazide sulfonic acid ester containing a hindered phenol skeleton as the quinonediazide sulfonic acid ester. Any of the positive resist compositions disclosed in these publications are not a composition whose sensitivity, resolution, developability, heat resistance and focus latitude are well-balanced and which is superior in these properties.

SUMMARY OF THE INVENTION

An object of the invention is to provide a novel radiation sensitive resin composition.

Another object of the invention is to provide a radiation sensitive resin composition which is suitable for use as a positive resist in which generation of a scum is suppressed effectively and which has an excellent developability, can provide a good pattern shape, and is excellent in sensitivity and resolution, particularly focus latitude and heat resistance.

According to the present invention, the above objects of the invention can be attained by a radiation sensitive resin composition which contains an alkali soluble resin and at least one 1,2-quinonediazide compound selected from the group consisting of compounds represented by the following formula (1):

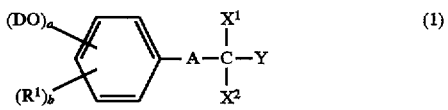

wherein $R_1$ is an alkyl group having 1 to 3 carbon atoms, a cycloalkyl group, an alkoxyl group having to 3 carbon atoms or an aryl group; D is an organic radical having a 1,2-quinonediazide group; a is an integer of 1 to 3; b is an integer of 0 to 4, provided that $1 \leq a+b \leq 5$; A is a single bond, a polymethylene group having 1 to 4 carbon atoms, a cycloalkylene group, a phenylene group, a group represented by the following formula (2):

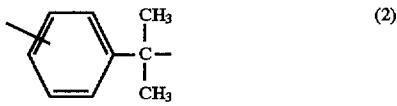

a carbonyl group, an ester group, an amide group or an ether group; Y is a hydrogen atom, an alkyl group or an aryl group; and $X^1$ and $X^2$ are the same or different and represented by the following formula (3):

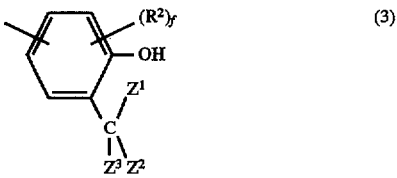

wherein each of $Z^1$, $Z^2$ and $Z^3$ is the same or different and is an alkyl group, a cycloalkyl group or an aryl group; $R^2$ is an alkyl group, a cycloalkyl group or an alkoxyl group; and f is an integer of 0 to 3, and compounds represented by the following formula (4):

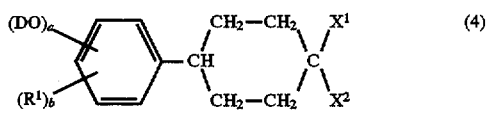

wherein $R^1$, D, a, b, $X^1$ and $X^2$ are defined the same as in the above formula (1).

The objects, constitution and effect of the present invention will become apparent from the following description.

DESCRIPTION OF THE PREFERRED EMBODIMENTS

Alkali Soluble Resin

Figure 1:
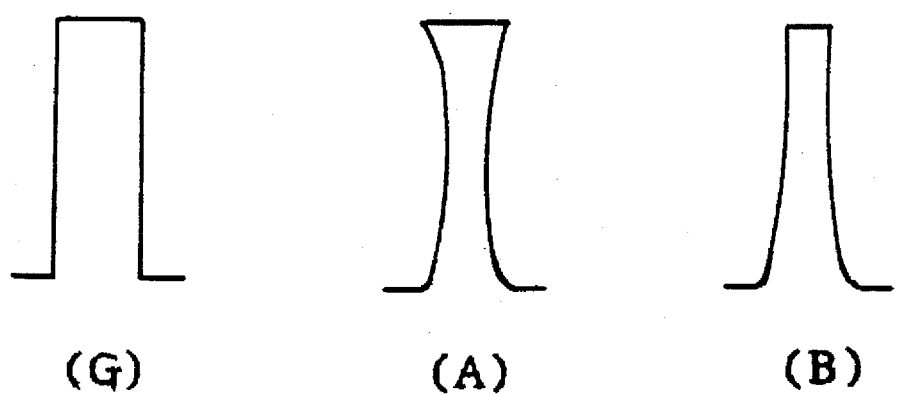
FIG. 1 shows typical sections of a resist pattern observed through a scanning electron microscope. Section (G) is good in shape and sections (A) and (B) are defective in shape.

Illustrative examples of the alkali soluble resin (to be referred to as "resin (A)" hereinafter) used in the present invention include novolak resins, polyvinyl phenol and derivatives thereof, styrene-maleic anhydride copolymers and derivatives thereof, polyvinylhydroxy benzoate, carboxyl group-containing (meth)acrylic acid-based resins and the like.

Resins typified by the above polymers may be used alone or in combination of two or more as resin (A).

The resin (A) is preferably a novolak resin. The novolak resin can be obtained by polycondensing a phenol represented by the following formula (9):

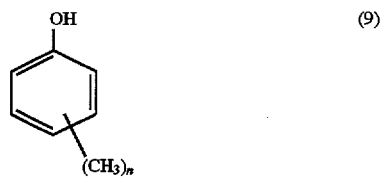

wherein n is an integer of 0 to 3, with an aldehyde such as a monoaldehyde compound or a dialdehyde compound.

Illustrative examples of the phenol include phenol, o-cresol, m-cresol, p-cresol, 2,3-xylenol, 2,5-xylenol, 3,4-xylenol, 3,5-xylenol, 2,3,5-trimethyl phenol, 3,4,5-trimethyl phenol and the like., Particularly, m-cresol, p-cresol, 2,3-xylenol, 2,5-xylenol, 3,4-xylenol, 3,5-xylenol and 2,3,5-trimethylphenol are preferred. These phenols may be used alone or in combination of two or more.

When phenols are used in combination of two or more, combinations of m-cresol, 2,3-xylenol and 3,4-xylenol (weight ratio of 20~95/5~80/0~75 based on 100 parts by weight of the total), and m-cresol, 2,3,5-trimethyl phenol and 2,3-xylenol (weight ratio of 20~95/5~80/0~75 based on 100 parts by weight of the total) are particularly preferred.

Illustrative examples of the monoaldehyde to be polycondensed with the above phenol include formaldehyde, trioxane, paraformaldehyde, benzaldehyde, acetoaldehyde, propylaldehyde, phenylacetoaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural and the like. Illustrative examples of the dialdehyde include glyoxal, glutaraldehyde, terephthalaldehyde, isophthalaldehyde and the like. Among these, formaldehyde is particularly preferred.

A formaldehyde such as formalin, trioxane, paraformaldehyde or the like or a hemformal such as methyl hemiformal, ethyl hemiformal, propyl hemiformal, butyl hemiformal, phenyl hemiformal or the like can be used as a material for the above formaldehyde. Among these, formalin and butyl hemiformal are particularly preferred.

These aldehydes may be used alone or in combination of two or more. The amount of the aldehyde used is preferably 0.7 to 3 moles, more preferably 0.8 to 1.5 moles, per mole of the phenol.

An acidic catalyst is generally used in a polycondensation reaction between a phenol and an aldehyde. Illustrative examples of the acidic catalyst include hydrochloric acid, nitric acid, sulfuric acid, p-toluene sulfonic acid, formic acid, oxalic acid, acetic acid and the like. The amount of the acidic catalyst used is generally $1 \times 10^{-5}$ to $5 \times 10^{-1}$ moles per mole of a phenol.

In a polycondensation reaction, water is generally used as a reaction medium. When the phenol used in the reaction does not dissolve in an aqueous solution of an aldehyde and becomes nonuniform at the initial stage of the reaction, a hydrophilic solvent can be used as the reaction medium. Illustrative examples of the hydrophilic solvent include alcohols such as methanol, ethanol, propanol, butanol and propyleneglycol monomethylether; and cyclic ethers such as tetrahydrofuran and dioxane. The amount of the reaction medium used is generally 20 to 1,000 parts by weight based on 100 parts by weight of reaction materials.

The polycondensation reaction temperature can be suitably adjusted according to the reactivity of the starting materials, while is generally 10° to 200° C.

As a polycondensation reaction method, a method in which a phenol, an aldehyde and an acidic catalyst are charged at the same time, and a method in which an phenol, an aldehyde and the like are added gradually with the proceeding of the reaction in the presence of an acidic catalyst may be suitably employed.

With a view to removing unreacted starting materials, acidic catalyst, reaction medium and the like present in the system after completion of a polycondensation reaction, the reaction temperature is elevated to 130° to 230° C. to remove volatile components under reduced pressure and collect a novolak resin.

The weight average molecular weight in terms of styrene (to be referred to as "Mw" hereinafter) of the novolak resin used in the present invention is preferably 2,000 to 20,000, more preferably 3,000 to 15,000 from the viewpoint of the operability at the time when the composition of the present invention is coated onto a substrate and for the viewpoint of the developability, sensitivity and heat resistance when it is used as a resist.

To obtain a novolak resin having a high Mw in particular, the novolak resin obtained by the above methods is dissolved in a good-solvent such as ethylene glycol monoethyl ether acetate, 3-methoxymethyl propionate, dioxane, methanol, ethyl acetate or the like, and then mixed with a poor-solvent such as water, n-hexane or n-heptane. Thereafter, a resin solution layer precipitated is isolated to collect a novolak resin having a high molecular weight.

Dissolution Promoter

In the present invention, a phenol compound having a low molecular weight (to be referred to as "dissolution promoter" hereinafter) may be added for the purpose of promoting the alkali solubility of the resin (A). The dissolution promoter is preferably a phenol compound having 2 to 6 benzene rings, whose examples include compounds represented by the following formulas (10-1) to (10-9).

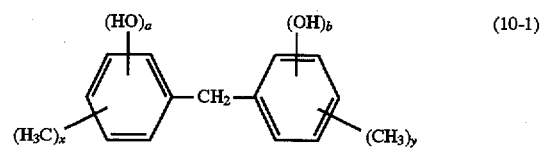

(10-1)

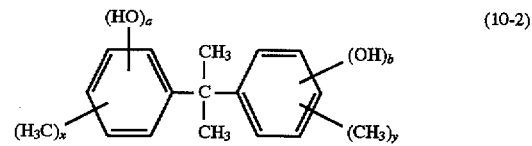

(10-2)

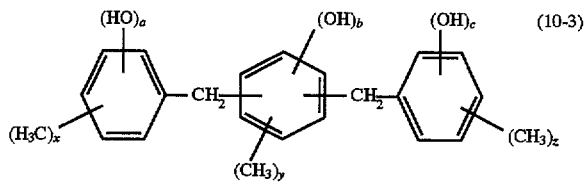

(10-3)

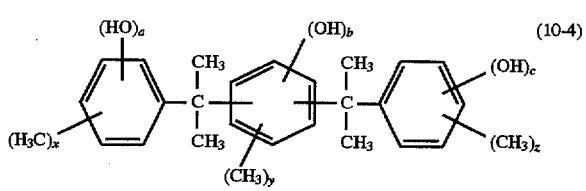

(10-4)

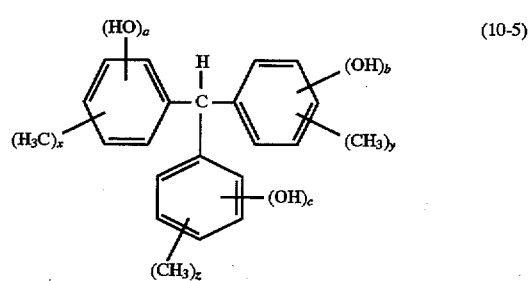

(10-5)

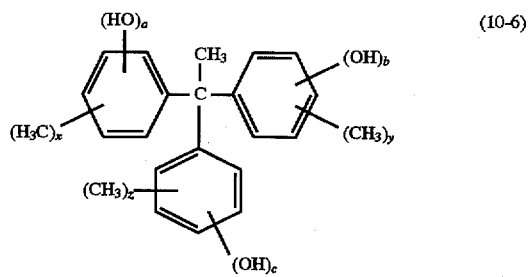

(10-6)

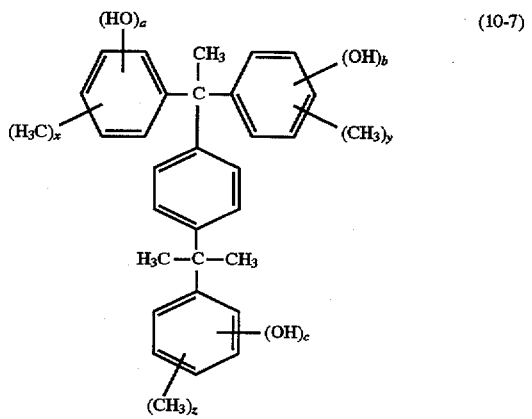

(10-7)

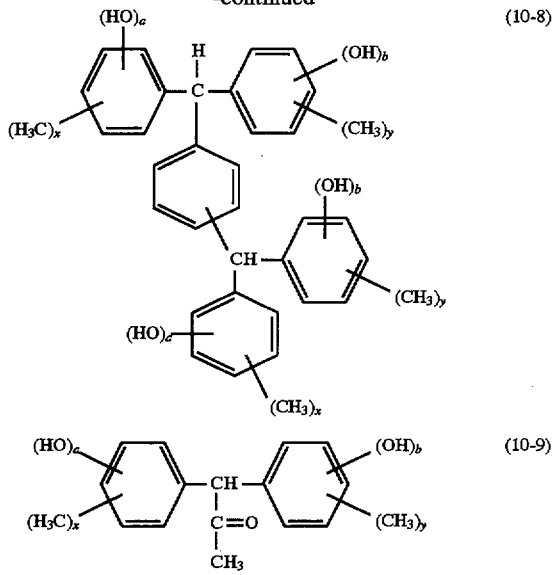

In the formulas (10-1) to (10-9), a, b and c are each an integer of 0 to 3 (not all can be 0), x, y and z are each an integer of 0 to 3, a+x≦5, b+y≦5 and c+z≦5 (provided that b+y≦4 for the formulas (10-3) and (10-4)).

Among these dissolution promoters, compounds represented by the above formulas (10-2), (10-6), (10-7) and (10-9) are preferred, and compounds represented by the formula (10-9) are particularly preferred.

The amount of the dissolution promoter used is generally 50 parts or less by weight, preferably 5 to 50 parts by weight, based on 100 parts by weight of the resin (A).

Other Alkali Soluble Resins

In the present invention, part of the resin (A) may be substituted by an alkali soluble resin having a low molecular weight (to be referred to as "resin B" hereinafter) for the purpose of promoting the alkali solubility of the resin (A).

Illustrative examples of the resin (B) include alkali soluble novolak resins and alkali soluble resol resins. These resins can be obtained from a polycondensation reaction between the afore-mentioned phenol and aldehyde. In addition to the above examples of the phenol used in the synthesis of the novolak resin, 1-naphthol, 2-naphthol and the like may be used as the phenol. The aldehydes used in the synthesis of the novolak resin may be used as the aldehyde. The amount of the aldehyde used is generally 0.2 to 0.8 mole per mole of the phenol. In this polycondensation reaction, an alkaline catalyst such as pyridine, triethylamine or the like may be used in the production of a resol resin, in addition to the acidic catalyst used in the production of a novolak resin.

Mw of the resin (B) is preferably 200 or more and less than 2,000, particularly preferably 300 to 1,000. Illustrative examples of the resin (B) include phenol/formaldehyde condensation resins, o-cresol/formaldehyde condensation resins, m-cresol/formaldehyde condensation resins, p-cresol/formaldehyde condensation resins, m-cresol/p-cresol/formaldehyde condensation resins and the like. The amount of the resin B used is generally 50 parts or less by weight based on 100 parts by weight of the total of the resin (A) and the resin (B).

1,2-Quinonediazide Compound

The composition of the present invention contains a compound(s) represented by the above formula(s) (1) and/or (4) as the 1,2-quinonediazide compound(s).

In the formulas (1) and (4), $R^1$ is selected from the group consisting of an alkyl group having 1 to 3 carbon atoms, an alkoxyl group having 1 to 3 carbon atoms, a cycloalkyl group and an aryl group.

Illustrative examples of the alkyl group having 1 to 3 carbon atoms include methyl, ethyl, n-propyl, isopropyl and the like. Illustrative examples of the alkoxyl group having 1 to 3 carbon atoms include methoxy, ethoxy, propoxy and the like. Examples of the cycloalkyl group include cyclopentyl, cyclohexyl and the like. The aryl group is preferably an aryl group having 6 to 10 carbon atoms whose examples include phenyl, toluyl, naphthyl and the like.

In the formulas (1) and (4), D is an organic radical having a 1,2-quinonediazide group. The organic radical having a 1,2-quinonediazide group is preferably a 1,2-quinonediazide sulfonyl group such as 1,2-benzoquinonediazide-4-sulfonyl group, 1,2-naphthoquinonediazide-4-sulfonyl group, 1,2-naphthoquinonediazide-5-sulfonyl group, or 1,2-naphthoquinonediazide-6-sulfonyl group. Particularly, 1,2-naphthoquinonediazide-4-sulfonyl group and 1,2-naphthoquinonediazide-5-sulfonyl group are preferred.

In the formula (1), A is selected from the group consisting of a single bond, a polymethylene group having 1 to 4 carbon atoms, a cycloalkylene group, phenylene group, a compound represented by the following formula (2):

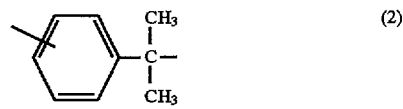

a carbonyl group, an ester group, an amide group and an ether group. The polymethylene group is preferably an ethylene group, and the cycloalkylene group is preferably a cyclopentylene group or a cyclohexylene group.

In the formula (1), Y is selected from the group consisting of a hydrogen atom, an alkyl group and an aryl group. The alkyl group is preferably an alkyl group having 1 to 4 carbon atoms whose examples include methyl, ethyl, n-propyl, isopropyl, n-butyl, t-butyl and the like. Illustrative examples of the aryl group are the same as in $R^1$.

In the formulas (1) and (4), $X^1$ and $X^2$ are organic radicals represented by the formula (3).

In the formula (3), $R^2$ is selected from the group consisting of an alkyl group, an alkoxyl group and a cycloalkyl group. Illustrative examples of the alkyl group are the same as in $R^1$. The alkoxyl group is preferably an alkoxyl group having 1 to 4 carbon atoms whose examples include methoxy, ethoxy, propoxy, butoxy and the like. Examples of the cycloalkyl group are the same as in $R^1$.

In the formula (3), $Z^1$ to $Z^3$ are each selected from the group consisting of an alkyl group, a cycloalkyl group and an aryl group. Illustrative examples of the alkyl group, cycloalkyl group and aryl group are the same as in $R^1$.

Illustrative examples of the compound represented by the formula (1) or (4) (to be referred to as "compound (a)" hereinafter) include compounds represented by the following formulas (11-1) to (11-60).

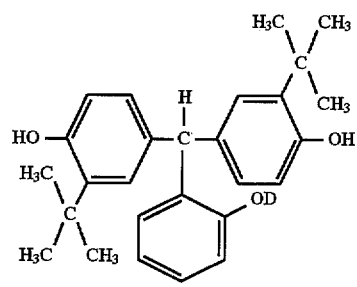 (11-1)
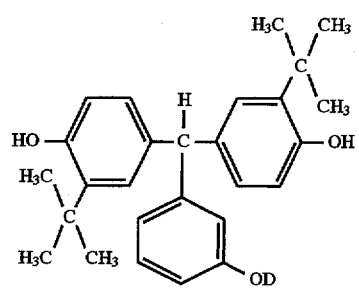 (11-2)
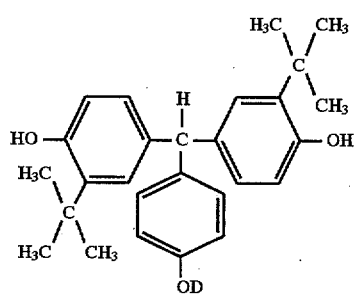 (11-3)
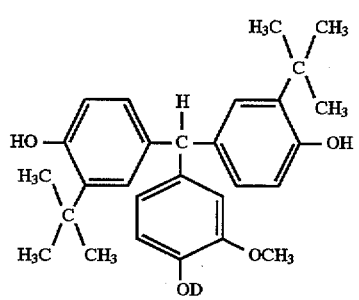 (11-4)
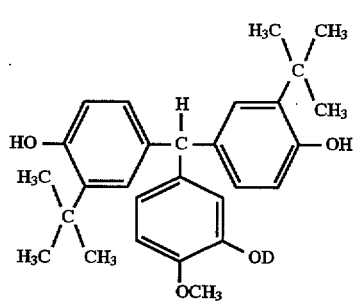 (11-5)
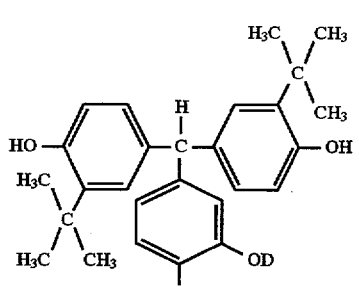 (11-6)
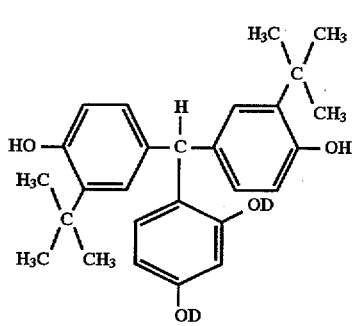 (11-7)
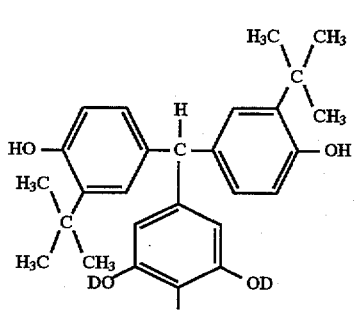 (11-8)
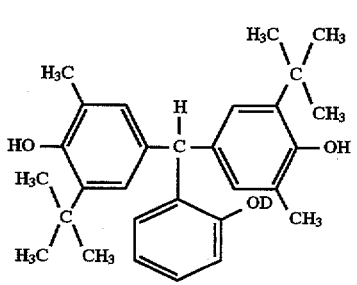 (11-9)
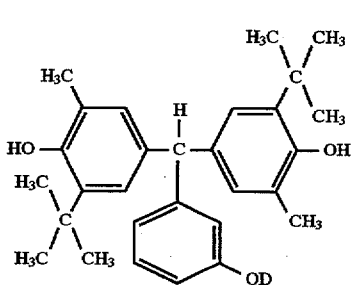 (11-10)

-continued
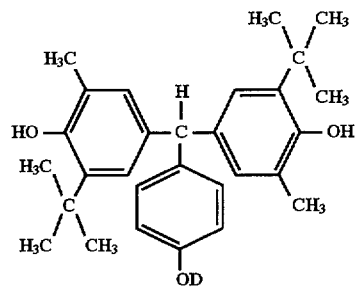
(11-11)
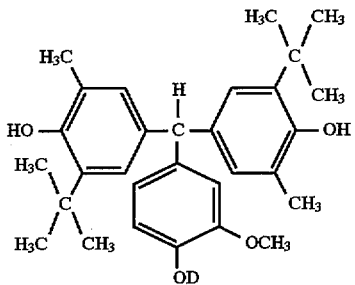
(11-12)
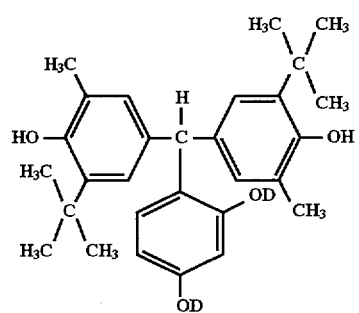
(11-13)
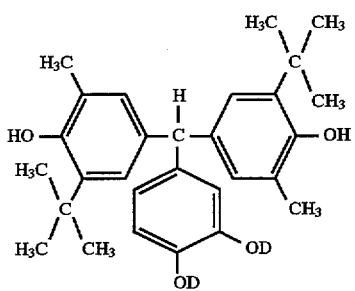
(11-14)
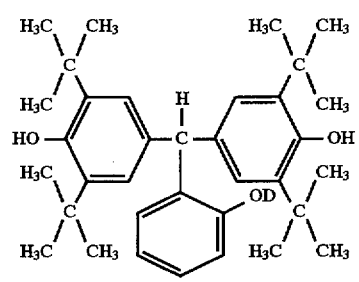
(11-15)
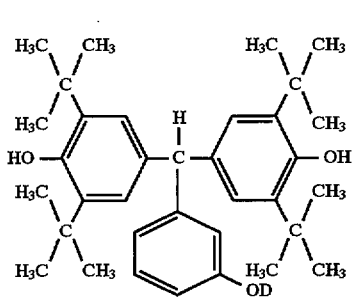
(11-16)
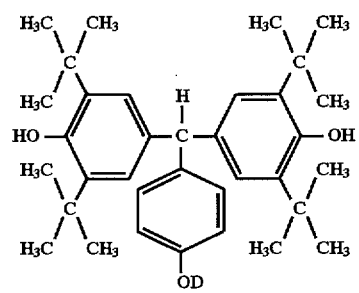
(11-17)
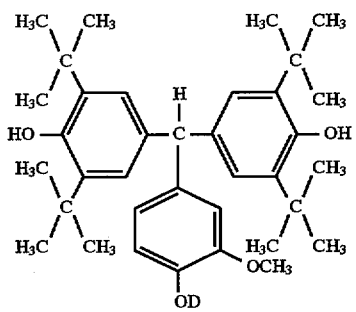
(11-18)
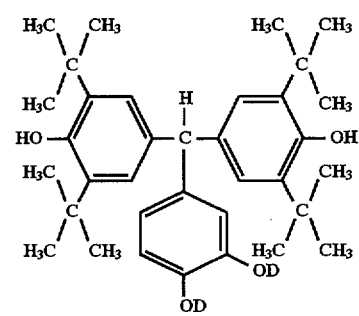
(11-19)
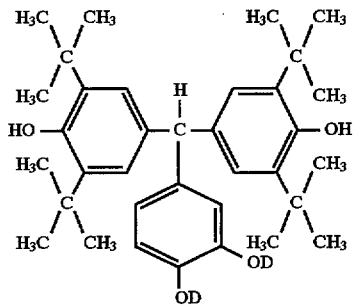
(11-20)

-continued
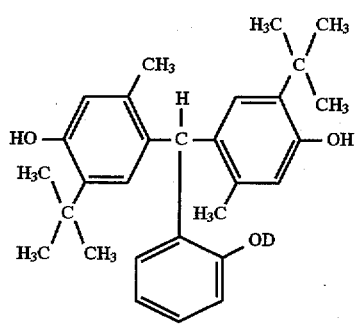 (11-21)
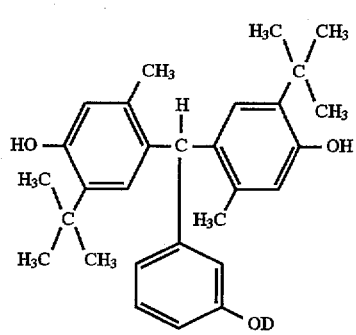 (11-22)
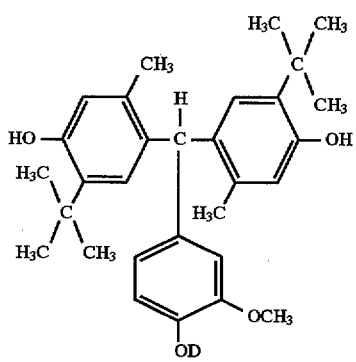 (11-23)
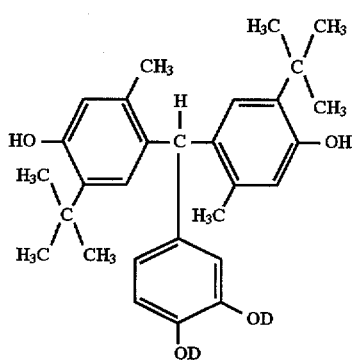 (11-24)
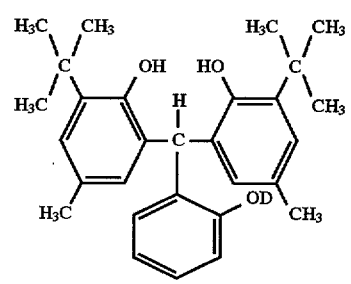 (11-25)
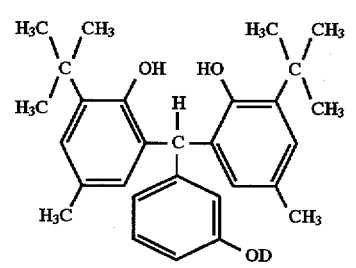 (11-26)
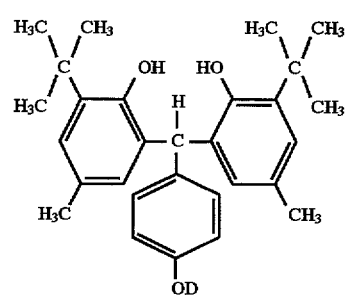 (11-27)
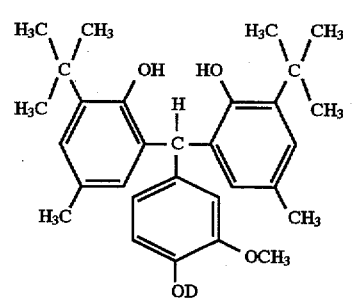 (11-28)
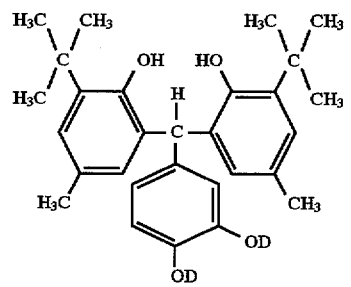 (11-29)
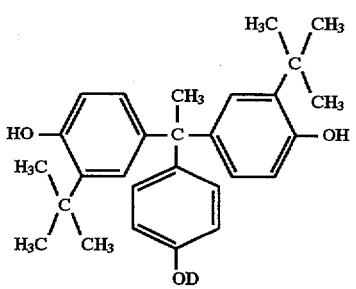 (11-30)

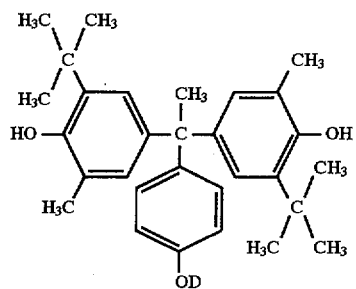 (11-31)
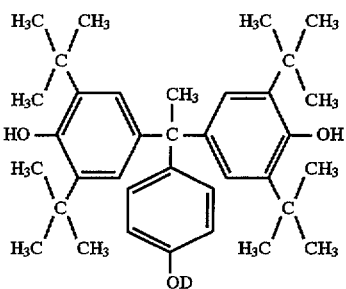 (11-32)
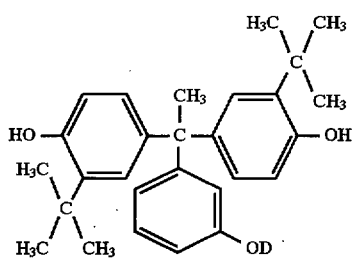 (11-33)
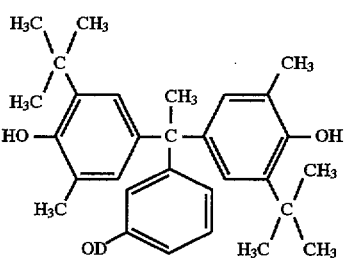 (11-34)
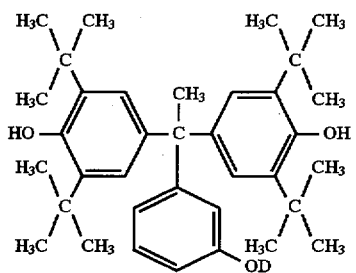 (11-35)
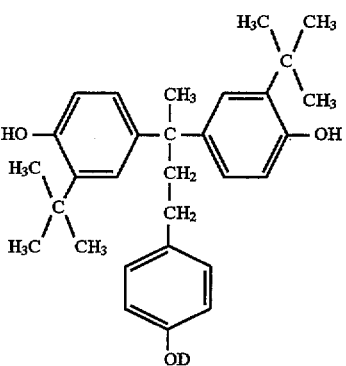 (11-36)
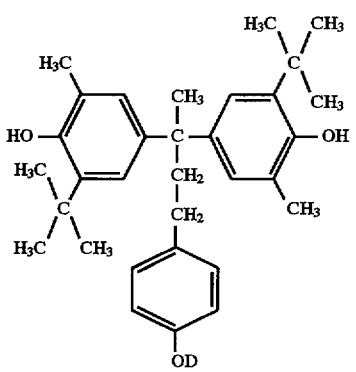 (11-37)
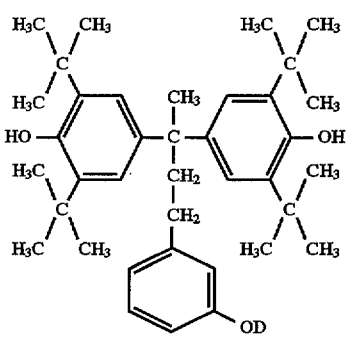 (11-38)

-continued
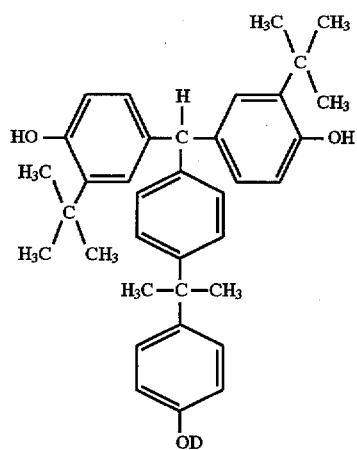
(11-39)
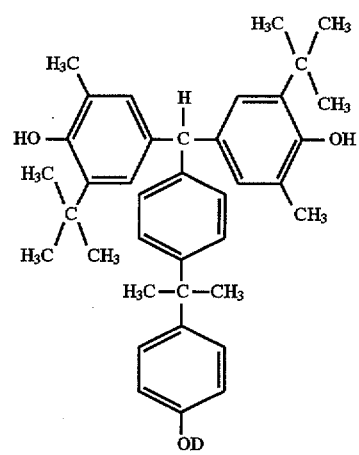
(11-40)
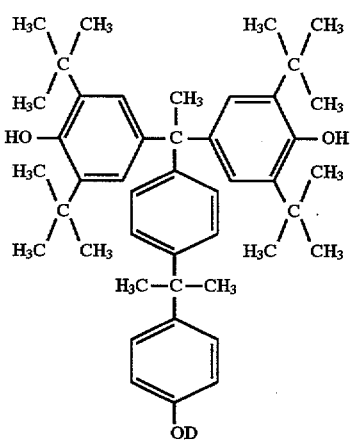
(11-41)
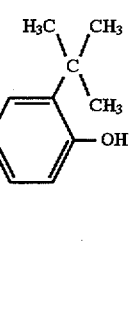
(11-42)
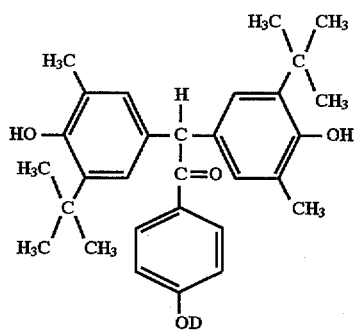
(11-43)
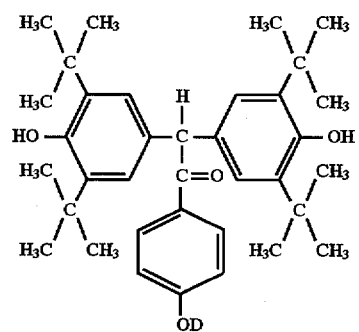
(11-44)
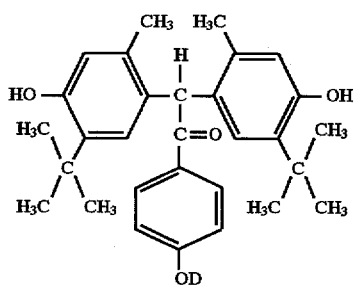
(11-45)
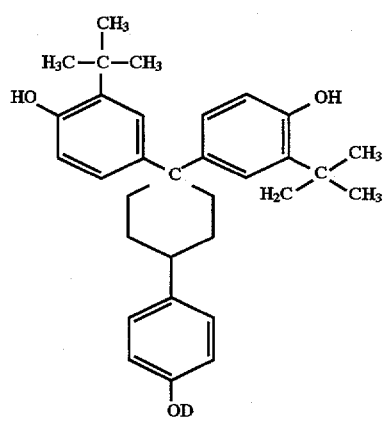
(11-46)

-continued
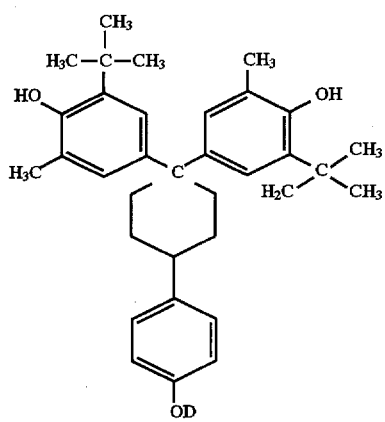
(11-47)
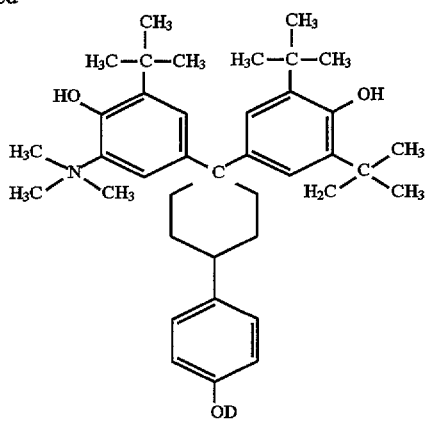
(11-48)
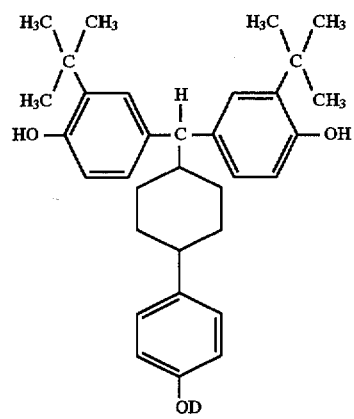
(11-49)
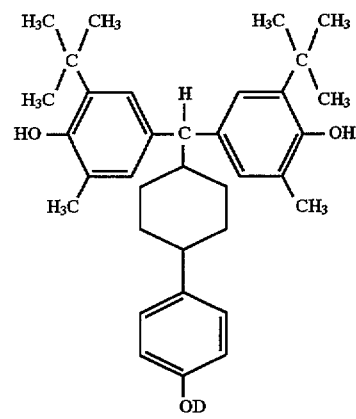
(11-50)
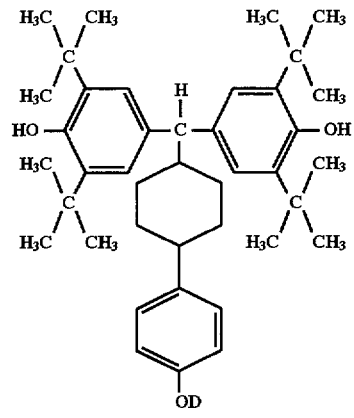
(11-51)
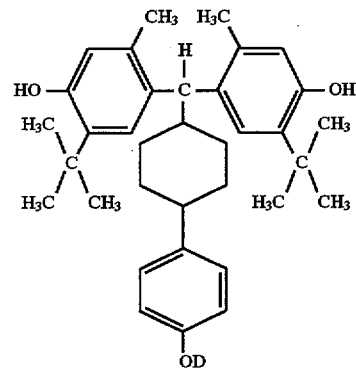
(11-52)
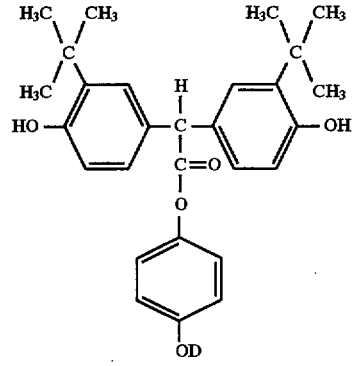
(11-53)
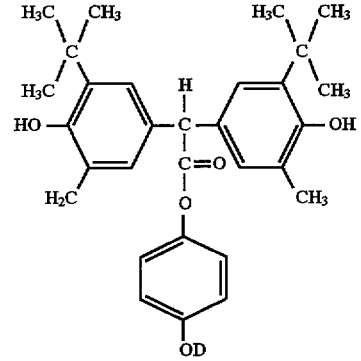
(11-54)

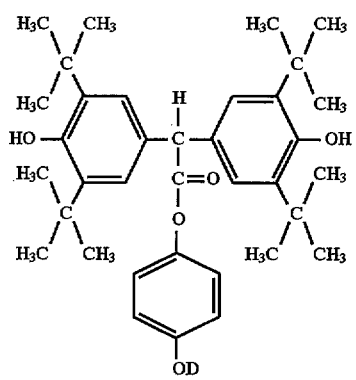 (11-55)

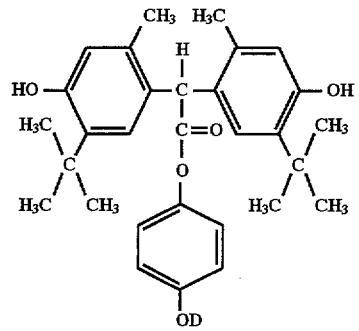 (11-56)

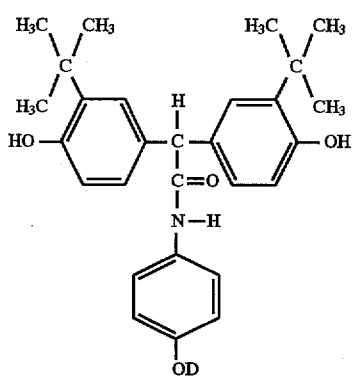 (11-57)

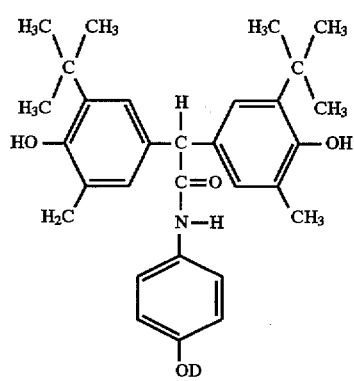 (11-58)

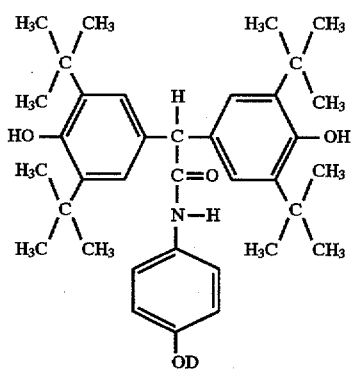 (11-59)

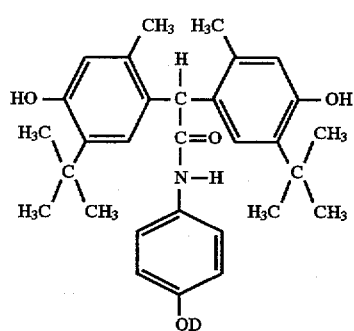 (11-60)

In the formulas (11-1) to (11-60), D is defined the same as above.

The compound of the formula (1) wherein D is a hydrogen atom can be obtained by reacting a compound represented by the following formula (12):

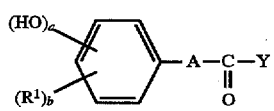 (12)

wherein $R^1$, a, b, A and Y are defined the same as in the formula (1), with a phenolic compound represented by the following formula (13):

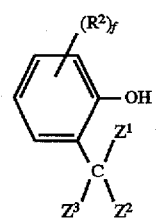 (13)

wherein $Z^1$, $Z^2$, $Z^3$, $R^2$ and f are the same as in the formula (3)

in the presence of an acidic catalyst such as hydrochloric acid, sulfuric acid or p-toluene sulfonic acid.

The compound of the formula (4) wherein D is a hydrogen atom can be obtained by reacting a compound represented by the following formula (14):

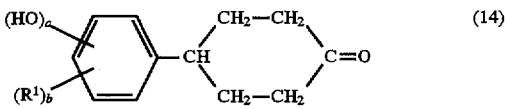

(14)

wherein R¹ and a are the same as in the above formula (4), with a phenolic compound represented by the above formula (13) in the presence of an acidic catalyst such as hydrochloric acid, sulfuric acid or p-toluene sulfonic acid.

The compound (a) can be obtained by reacting the compound of the formula (1) or (4) in which D is a hydrogen atom with 1,2-naphthoquinonediazide sulfonyl halide in the presence of an basic catalyst such as triethyl amine.

In the composition of the present invention, the compound (a) is preferably used in a proportion of 1 to 50 parts by weight, particularly preferably 3 to 30 parts by weight, based on 100 parts by weight of the resin (A). The above compounds (a) may be used alone or in combination of two or more.

Other 1,2-Quinonediazide Compound

In the present invention, a 1,2-quinonediazide compound other than the compound (a) (to be referred to as "other 1,2-quinonediazide compound" hereinafter), such as 1,2-benzoquinonediazide-4-sulfonic acid ester, 1,2-naphthoquinonediazide-4-sulfonic acid ester, or 1,2-naphthoquinonediazide-5-sulfonic acid ester can be used in combination with the compound (a). The other 1,2-quinonediazide compound is, for example, a 1,2-quinonediazide sulfonic acid ester such as 2,3,4-trihydroxybenzophenone, 2,3,4,4'-tetrahydroxybenzophenone, 2,2',3,4,4'-pentahydroxybenzophenone, tris(4-hydroxyphenyl) methane, 1,3,5-tris(4-hydroxy-α,α-dimethylbenzyl) benzene, 1,1-bis(4-hydromyphenyl)-1-[4-{1-(4-hydroxyphenyl)-1-methylethyl}phenyl]ethane, 2-(3,4-dihydroxyphenyl)-2-(4-hydroxyphenyl)propane, 2,4,4-trimethyl-2-(2,4-dihydroxyphenyl)-7-hydroxychroman, 4,6-bis{1-(4-hydroxyphenyl)-1-methylethyl}-1,3-dihydroxybenzene or 2-methyl-2-(2,4-dihydroxyphenyl)-4-(4-hydroxyphenyl)-7-hydroxychroman. Among these 1,2-quinonediazide sulfonic acid esters, 1,2-naphthoquinonediazide-4-sulfonic acid ester and 1,2-naphthoquinonediazide-5-sulfonic acid ester are particularly preferred.

In the composition of the present invention, the proportion of the other 1,2-quinonediazide compound is generally 100 parts or less by weight, preferably 5 to 50 parts by weight, based on 100 parts by weight of the resin (A).

The total weight of the 1,2-quinonediazide sulfonyl residues contained in the composition of the present invention is preferably adjusted to 5 to 50% by weight, particularly preferably 10 to 30% by weight, of the total solid content of the composition.

Compounding Agents

The composition of the present invention may contain a variety of compounding agents such as a sensitizer, surfactant and the like as required.

The sensitizer is blended to improve the sensitivity of a resist. Illustrative examples of the sensitizer include 2H-pyrido-(3,2-b)-1,4-oxazin-3(4H)-ones, 10H-pyrido-(3,2-b)-(1,4)-benzothiazines, urazols, hydantoins, barbituric acids, glycine anhydrides, 1-hydroxybenzotriazoles, alloxans, maleimides and the like. The proportion of the sensitizer is preferably 50 parts or less by weight based on 100 parts by weight of the resin (A).

The surfactant is blended to improve the coatability and developing properties of the composition. Illustrative examples of the surfactant include polyoxyethylene lauryl ether, polyoxyethylene octylphenyl ether, polyoxyethylene nonylphenyl ether, polyethylene glycol dilaurate, polyethylene glycol distearate, Megafax F171, F172 and F173 (trade names, manufactured by Dainippon Ink and Chemicals, Inc.), Florado FC430 and FC431 (trade names, manufactured by Sumitomo 3M), Asahi Guard AG 710, Surflon S-382, SC-101, SC-102, SC-103, SC-104, SC-105 and SC-106 (trade names, manufactured by Asahi Glass Co.), KP341 (trade name, manufactured by Shinetsu Chemical Co.), Polyflow No. 75 and No. 95 (trade names, manufactured by Kyoeisha Yushi Kagaku Kogyo Co. Ltd.) and the like.

The proportion of the surfactant is preferably such that the effective ingredient of the surfactant is contained in an amount of 2 parts or less by weight based on 100 parts by weight of the solid content of the composition excluding compounding agents.

The composition of the present invention may further contain a dye or pigment to visualize a latent image on a radiation exposed portion of a resist and to reduce the influence of halation at the time of exposure to radiation, and an adhesive aid to improve adhesion. It may still further contain a storage stabilizer and an anti-foaming agent as required.

Solvent

The composition of the present invention is prepared by dissolving the above resin (A) and compound (a) and, as required, a dissolution promoter, the resin (B), other 1,2-quinonediazide compound and various compounding agents in a solvent so as to have a solid content concentration of 20 to 40% by weight and filtrating the resulting solution with a filter having a pore diameter of 0.2 μm.

Illustrative examples of the solvent include ethylene glycol monomethyl ether, ethylene glycol monoethyl ether, ethylene glycol monomethyl ether acetate, ethylene glycol monoethy ether acetate, diethylene glycol monomethyl ether, diethylene glycol monoethyl ether, propylene glycol methylether acetate, propylene glycol propylether acetate, propylene glycol methylether propionate, toluene, xylene, methyl ethyl ketone, 2-heptanone, 3-heptanone, 4-heptanone, cyclohexanone, ethyl 2-hydroxypropionate, ethyl 2-hydroxy-2-methyl propionate, methyl 2-methoxy-2-methyl propionate, ethyl ethoxyacetate, ethyl hydroxyacetate, methyl 2-hydroxy-3-methyl butyrate, methyl 3-methoxy propionate, ethyl 3-methoxypropionate, ethyl 3-ethoxypropionate, ethyl acetate, butyl acetate, methyl pyruvate, ethyl pyruvate and the like. Further, these solvents may be blended with high-boiling solvents such as N-methylformamide, N,N-dimethylformamide, N-methylformanilide, N-methylacetoamide, N,N-dimethylacetoamide, N-methylpyrrolidone, dimethylsulfoxide, benzylethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, ethylene glycol monophenyl ether acetate and the like. These solvents may be used alone or in combination of two or more.

Formation of Resist Film

The composition of the present invention prepared as a solution is coated on a substrate such as a silicon wafer or a wafer coated with aluminum by a rotation coating, cast coating, roll coating or the like. Thereafter, the composition coated on the substrate is prebaked to form a resist film and then the resulting resist film is exposed to radiation (to be referred to as "exposure" hereinafter) and developed with a developing solution to form a desired resist pattern.

The radiation used herein is preferably an ultraviolet ray such as g-line or i-line, while a far ultraviolet ray such as an excimer laser beam, an X-ray such as a synchrotron radiation, a charged particle beam such as an electron beam and other radiations may also be used.

After the formation of a resist film, prebaking and exposure, the composition of the present invention is subjected to a heat treatment at 70° to 140° C. (to be referred to as "baking after exposure" hereinafter) and then to a developing treatment to further improve the effect of the present invention.

The developing solution used for the resist film is an alkaline aqueous solution prepared by dissolving an alkaline compound such as sodium hydroxide, potassium hydroxide, sodium carbonate, sodium silicate, sodium metasilicate, ammonia, ethyl amine, n-propylamine, diethyl amine, di-n-propyl amine, triethyl amine, methyl diethyl amine, dimethyl ethanol amine, triethanol amine, tetramethyl ammonium hydroxide, tetraethyl ammonium hydroxide, choline, pyrrole, piperidine, 1,8-diazabicyclo[5.4.0]-7-undecene, 1,5-diazabicyclo[4.3.0]-5-nonene or the like in a concentration of 1 to 10% by weight.

The developing solution may contain a water-soluble organic solvent, for example, an alcohol such as methanol or ethanol, and a surfactant in a suitable amount.

When the developing solution consisting of such an alkaline aqueous solution is used, the film is usually rinsed with deionized water after developing.

Examples

The following examples are given to further illustrate the present invention.

<Measurement and evaluation>

The measurement of Mw and the evaluation of resists in Examples were carried out in accordance with the following methods.

<Mw>

GPC columns ($2 \times G2000H_{XL} + 1 \times G3000H_{XL} + 1 \times G4000H_{XL}$) manufactured by Toso Co. were used to measure Mw by gel permeation chromatography using monodisperse polystyrene as the standard under the following analytical conditions.

flow rate: 1.0 ml/minute
eluting solvent: tetrahydrofuran
column temperature: 40° C.

<HPLC ( high-performance liquid chromatography )>

Using an HPLC column (Inertsil ODS5) manufactured by Gasukuro Kogyo Co. Ltd, 3 µl of a solution of 20 mg of a sample dissolved in 10 ml of acetonitrile was analyzed by HPLC ( high-performance liquid chromatography ) method under the following analytical conditions.

flow rate: 1.0 ml/minute
elute solution: acetonitrile/aqueous solution of 0.1% of phosphoric acid (volume ratio: 80/20).

Detection was conducted by measuring the absorbance of the sample at the wavelength of 280 nm.

The mixing ratio of compounds which differ in ester exchange rate was obtained from the area ratio of peaks corresponding to the respective compounds by drawing a graph showing elution time and absorbance.

<Resolution>

The minimum size at which a line-and-space pattern was separated, without causing reduction of the film, with the amount of exposure when a 0.4 µm line-and-space pattern was resolved into 1:1 was measured with a scanning electron microscope.

<Focusing Range (Focus Latitude)>

Using a scanning electron microscope, a focusing fluctuation width when the resolved pattern size of a 0.4 µm line-and-space pattern is within ±10% of its mask design size was taken as a focusing range and used as an evaluation index. A large focusing range means that the film has good focus latitude.

<Developability>

Scum and undeveloped portions after the formation of a resist pattern were checked with a scanning electron microscope.

<Heat resistance>

A wafer having a resist pattern formed thereon was placed in a clean oven, and a temperature at which the pattern began to break was measured.

<Pattern shape>

A resist pattern was formed on a silicon wafer and the section of the resist pattern having a 0.4 µm line width after developing was observed through a scanning electron microscope. The sections of resist patterns are shown in FIG. 1. Section (G) is good in shape whereas sections (A) and (B) are defective in shape.

<Synthesis of resin (A)>

Synthesis Example 1

69.2 g (0.64 mole) of m-cresol, 9.8 g (0.08 mole) of 2,3-xylenol, 9.8 g (0.08 mole) of 3,4-xylenol, 61.0 g (formaldehyde: 0.75 mole) of an aqueous solution of 37% by weight of formaldehyde, 6.3 g (0.05 mole) of oxalic acid dihydrate, 52.6 g of water and 182 g of dioxane were charged into an autoclave which was then immersed in an oil bath. The temperature inside the autoclave was maintained at 130° C. to condense these materials for 8 hours under agitation. After the reaction, the autoclave was cooled to room temperature, and the contents were taken out into a beaker. The contents were separated into two layers in the beaker, and a lower layer was taken out, concentrated, dehydrated and dried to collect a novolak resin. This resin is referred to as "resin (A1)". The resin (A1) had an Mw of 8,600.

Synthesis Example 2

64.9 g (0.6 mole) of m-cresol, 36.7 g (0.3 mole) of 2,3-xylenol, 12.2 g (0.1 mole) of 3,4-xylenol, 77.1 g (formaldehyde: 0.9 mole) of an aqueous solution of 37% by weight of formaldehyde, 6.3 g (0.05 mole) of oxalic acid dihydrate, 79.4 g of water and 383.9 g of dioxane were charged into an autoclave and the same operation as in Synthesis Example 1 was carried out to synthesize a novolak resin. This resin is referred to as "resin (A2)". The resin (A2) had an Mw of 7,800.

Synthesis Example 3

43.2 g (0.1 mole) of the compound of the above formula (11—11) in which D is a hydrogen atom, 26.9 g (0.1 mole) of 1,2-naphthoquinonediazide-5-sulfonyl chloride and 320 g of dioxane were charged into a flask equipped with a stirrer, dropping funnel and thermometer under shielded light and dissolved under agitation. Thereafter, the flask was immersed in a water bath controlled at 30° C., 11.1 g (0.11 mole) of triethyl amine was added to This solution using the dropping funnel so that the temperature inside the flask did not exceed 35° C. when the temperature became constant at 30° C., and a reaction was carried out at the same temperature for 2 hours. The triethyl amine hydrochloride precipitated was then removed by filtration and the filtrate was poured into a large amount of an aqueous solution of diluted hydrochloric acid to precipitate a reaction product which was then separated by filtration, collected, dried in a vacuum drier at 40° C. for 24 hours to obtain a 1,2-quinonediazide compound (a-1).

Synthesis Example 4

A 1,2-quinonediazide compound (a-2) was obtained in the same manner as in Synthesis Example 3 except that 43.2 g (0.1 mole) of the compound of the above formula (11–22) in which D is a hydrogen atom, 26.9 g (0.1 mole) of 1,2-naphthoquinonediazide-5-sulfonyl chloride, 320 g of dioxane and 11.1 g (0.11 mole) of triethyl amine were used.

Synthesis Example 5

A 1,2-quinonediazide compound (a-3) was obtained in the same manner as in Synthesis Example 3 except that 41.8 g (0.1 mole) of the compound of the above formula (11–31) in which D is a hydrogen atom, 26.9 g (0.1 mole) of 1,2-naphthoquinonediazide-5-sulfonyl chloride, 320 g of dioxane and 11.1 g (0.11 mole) of triethyl amine were used.

Synthesis Example 6

A 1,2-quinonediazide compound (a-4) was obtained in the same manner as in Synthesis Example 3 except that 47.2 g (0.1 mole) of the compound of the above formula (11–46) in which D is a hydrogen atom, 26.9 g (0.1 mole) of 1,2-naphthoquinonediazide-5-sulfonyl chloride, 340 g of dioxane and 11.1 g (0.11 mole) of triethyl amine were used.

Synthesis Example 7

A 1,2-quinonediazide compound (a-5) was obtained in the same manner as in Synthesis Example 3 except that 43.2 g (0.1 mole) of the compound of the above formula (11—42) in which D is a hydrogen atom, 26.9 g (0.1 mole) of 1,2-naphthoquinonediazide-5-sulfonyl chloride, 325 g of dioxane and 11.1 g (0.11 mole) of triethyl amine were used.

Synthesis Example 8

A 1,2-quinonediazide compound (a-6) was obtained in the same manner as in Synthesis Example 3 except that 52.2 g (0.1 mole) of the compound of the above formula (11-49) in which D is a hydrogen atom, 26.9 g (0.1 mole) of 1,2-naphthoquinonediazide-5-sulfonyl chloride, 360 g of dioxane and 11.1 g (0.11 mole) of triethyl amine were used.

Synthesis Example 9

A 1,2-quinonediazide compound (a-7) was obtained in the same manner as in Synthesis Example 3 except that 48.6 g (0.1 mole) of the compound of the above formula (11-49) in which D is a hydrogen atom, 26.9 g (0.1 mole) of 1,2-naphthoquinonediazide-5-sulfonyl chloride, 350 g of dioxane and 11.1 g (0.11 mole) of triethyl amine were used.

Synthesis Example 10

A 1,2-quinonediazide compound (a-8) was obtained in the same manner as in Synthesis Example 3 except that 44.8 g (0.1 mole) of the compound of the above formula (11-53) in which D is a hydrogen atom, 26.9 g (0.1 mole) of 1,2-naphthoquinonediazide-5-sulfonyl chloride, 330 g of dioxane and 11.1 g (0.11 mole) of triethyl amine were used.

Synthesis Example 11

A 1,2-quinonediazide compound (a-9) was obtained in the same manner as in Synthesis Example 3 except that 44.7 g (0.1 mole) of the compound of the above formula (11-57) in which D is a hydrogen atom, 26.9 g (0.1 mole) of 1,2-naphthoquinonediazide-5-sulfonyl chloride, 330 g of dioxane and 11.1 g (0.11 mole) of triethyl amine were used.

<Synthesis of other 1,2-quinonediazide compounds>

Synthesis Example 12

A 1,2-quinonediazide compound (I) was obtained in the same manner as in Synthesis Example 3 except that 34.8 g (0.1 mole) of a compound represented by the following formula (12), 26.9 g (0.1 mole) of 1,2-naphthoquinonediazide-5-sulfonyl chloride, 290 g of dioxane and 11.1 g (0.11 mole) of triethyl amine were used.

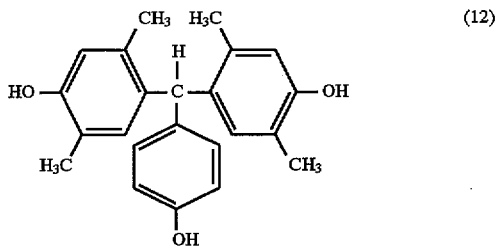

(12)

As the result of $^1$H-NMR analysis, it was found that the 1,2-quinonediazide compound (i) was a mixture of compounds having different ester exchange rates, in which average 33 mol % of the hydroxyl groups of the compound of the formula (12) was substituted by 1,2-naphthoquinonediazide-5-sulfonic acid ester. The result of HPLC analysis showed that the mixing proportion of the mixture of the compound (i) was 15% of the compound (unreacted product) of the formula (12), 43% of a monoester, 33% of a diester and 8% of a triester.

Synthesis Example 13

A 1,2-quinonediazide compound (II) was obtained in the same manner as in Synthesis Example 3 except that 34.8 g (0.1 mole) of the compound of the above formula (12), 53.7 g (0.2 mole) of 1,2-naphthoquinonediazide-5-sulfonyl chloride, 440 g of dioxane and 22.2 g (0.22 mole) of triethyl amine were used.

As the result of $^1$H-NMR analysis, it was found that the 1,2-quinonediazide compound (ii) is a mixture of compounds having different ester exchange rates, in which average 67 mol % of the hydroxyl groups of the compound of the formula (12) was substituted by 1,2-naphthoquinonediazide-5-sulfonic acid ester. The result of HPLC analysis showed that the mixing proportion of the mixture of the compound (ii) was 12% of a monoester, 45% of a diester and 43% of a triester.

Synthesis Example 14

A 1,2-quinonediazide compound (III) was obtained in the same manner as in Synthesis Example 3 except that 29.2 g (0.1 mole) of 1,1,1-tris(4-hydroxyphenyl)methane, 53.7 g (0.2 mole) of 1,2-naphthoquinonediazide-5-sulfonyl chloride, 420 g of dioxane and 22.2 g (0.22 mole) of triethyl amine were used.

As the result of $^1$H-NMR analysis, it was found that the 1,2-quinonediazide compound (iii) is a mixture of compounds having different ester exchange rates, in which average 67 mol % of the hydroxyl groups of 1,1,1-tris(4-hydroxyphenyl)methane was substituted by 1,2-naphthoquinonediazide-5-sulfonic acid ester. The result of HPLC analysis showed that the mixing proportion of the mixture of the compound (iii) was 15% of a monoester, 43% of a diester and 42% of a triester.

Examples 1 to 11 and Comparative Examples 1 to 3

The resin (A), a dissolution promoter, compound (a), other 1,2-quinonediazide compound and a solvent were mixed in a compounding ratio shown in Table 1 ("parts" stands for "parts by weight") to prepare a uniform solution. The solution was then filtered with a membrane filter having a pore diameter of 0.2 μm to prepare a solution of a composition.

The thus obtained solution was coated on a silicon wafer having a silicon oxide film thereon with a spinner, and prebaked on a hot plate at 90° C. for 2 minutes to form a 1.1

μm thick resist film. Thereafter, the film was exposed to light having a wavelength of 365 nm (i-line) through a reticle with the NSR-2005i9C reduction projection exposing apparatus (lens numerical aperture=0.57) manufactured by Nikon Ltd, developed with an aqueous solution of 2.38% by weight of tetramethyl ammonium hydroxide, rinsed with deionized water, and dried to form a resist pattern. The thus obtained resist pattern was examined to evaluate the properties of the resist pattern of the composition of each Example. Results are shown in Table 1.

TABLE 1

|  | Ex. 1 | Ex. 2 | Ex. 3 | Ex. 4 | Ex. 5 | Ex. 6 | Ex. 7 |
|---|---|---|---|---|---|---|---|
| Resin (A) | | | | | | | |
| Kind | A1 | A1 | A2 | A2 | A1 | A1 | A2 |
| Parts | 80 | 80 | 80 | 80 | 80 | 80 | 80 |
| Dissolution promoter | | | | | | | |
| Kind | α | β | α | α | β | β | α |
| Parts | 20 | 20 | 20 | 20 | 20 | 20 | 20 |
| 1,2-quinonediazide compound | | | | | | | |
| Component (a) | | | | | | | |
| Kind | a-1 | a-2 | a-2 | a-3 | a-1/a-2 | a-4 | a-5 |
| Parts | 20 | 20 | 15 | 15 | 5/10 | 20 | 15 |
| Others | | | | | | | |
| Kind | (I) | (II) | (II) | (III) | (III) | (II) | (III) |
| Parts | 15 | 15 | 20 | 20 | 20 | 15 | 20 |
| Solvent | | | | | | | |
| Kind | S1 | S1/S2 | S1/S2 | S1/S2 | S1/S2 | S1/S2 | S1/S2 |
| Parts | 340 | 240/100 | 240/100 | 240/100 | 240/100 | 240/100 | 240/100 |
| Resist properties | | | | | | | |
| Resolution (μm) | 0.34 | 0.32 | 0.32 | 0.30 | 0.30 | 0.32 | 0.30 |
| Depth of focus (μm) | 1.4 | 1.8 | 1.6 | 1.8 | 1.8 | 1.6 | 1.6 |
| Developability | good | good | good | good | good | good | good |
| Heat resistance (°C.) | 140 | 145 | 140 | 140 | 140 | 145 | 140 |
| Pattern shape | G | G | G | G | G | G | G |

|  | Ex. 8 | Ex. 9 | Ex. 10 | Ex. 11 | Ex. 12 | Ex. 13 | Ex. 14 |
|---|---|---|---|---|---|---|---|
| Resin (A) | | | | | | | |
| Kind | A2 | A2 | A1 | A1 | A1 | A2 | A2 |
| Parts | 80 | 80 | 80 | 80 | 80 | 80 | 80 |
| Dissolution promoter | | | | | | | |
| Kind | α | α | β | β | γ | γ | γ |
| Parts | 20 | 20 | 20 | 20 | 20 | 20 | 20 |
| 1,2-quinonediazide compound | | | | | | | |
| Component (a) | | | | | | | |
| Kind | a-6 | a-7 | a-8 | a-9 | a-1 | a-2 | a-5 |
| Parts | 15 | 20 | 20 | 20 | 10 | 15 | 15 |
| Others | | | | | | | |
| Kind | (III) | (III) | (II) | (II) | (II) | (III) | (I)/(II) |
| Parts | 20 | 15 | 15 | 15 | 25 | 20 | 20 |
| Solvent | | | | | | | |
| Kind | S1/S2 | S1/S2 | S1/S2 | S1/S2 | S1/S2 | S1/S2 | S1/S2 |
| Parts | 240/100 | 240/100 | 240/100 | 240/100 | 240/100 | 240/100 | 240/100 |
| Resist properties | | | | | | | |
| Resolution (μm) | 0.30 | 0.30 | 0.32 | 0.32 | 0.30 | 0.30 | 0.30 |
| Depth of focus (μm) | 1.8 | 1.8 | 1.8 | 1.6 | 1.6 | 1.6 | 1.8 |
| Developability | good | good | good | good | good | good | good |
| Heat resistance (°C.) | 140 | 140 | 145 | 145 | 140 | 145 | 140 |
| Pattern shape | G | G | G | G | G | G | G |

TABLE 1-continued

|  | Comp. Ex. 1 | Comp. Ex. 2 | Comp. Ex. 3 |
|---|---|---|---|
| Resin (A) | | | |
| Kind | A1 | A2 | A2 |
| Parts | 80 | 80 | 80 |
| Dissolution promoter | | | |
| Kind | β | α | α |
| Parts | 20 | 20 | 20 |
| 1,2-quinonediazide compound | | | |
| Component (a) | | | |
| Kind | — | — | — |
| Parts | — | — | — |
| Others | | | |
| Kind | (I)/(II) | (II) | (III) |
| Parts | 5/30 | 35 | 30 |
| Solvent | | | |
| Kind | S1/S2 | S1/S2 | S1/S2 |
| Parts | 240/100 | 240/100 | 240/100 |
| Resist properties | | | |
| Resolution (μm) | 0.34 | 0.32 | 0.32 |
| Depth of focus (μm) | 1.6 | 1.6 | 1.6 |
| Developability | scumming | scumming | scumming |
| Heat resistance (°C.) | 130 | 130 | 130 |
| Pattern shape | B | A | A |

In Table 1, types of the dissolution promoter and the solvent are as follows.

dissolution promoter
α: 1,1,1-tris(4-hydroxyphenyl)methane
β: 1,1-bis(4-hydroxyphenyl)-1-phenyl ethane
γ: 1,1-bis(4-hydroxy-2,5-dimethylphenyl)acetone solvent
S1: ethyl 2-hydroxpropionate
S2: methyl 3-methoxypropionate The radiation sensitive resin composition of the present invention has an excellent developability, provides a good pattern shape, is superior in sensitivity and resolution, and has greatly improved focus latitude and heat resistance in particular. Therefore, the radiation sensitive resin composition of the present invention can be suitably used as a resist for the production of LSIs.

What is claimed is:

1. A radiation sensitive resin composition containing, in admixture, an alkali soluble resin and a radiational effective amount of at least one 1,2-quinonediazide compound selected from the group consisting of compounds represented by the following formula (1):

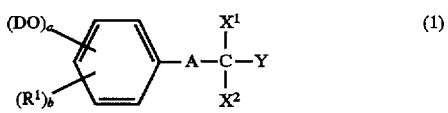 (1)

wherein $R^1$ is an alkyl group having 1 to 3 carbon atoms, a cycloalkyl group, an alkoxyl group having 1 to 3 carbon atoms or an aryl group; D is an organic radical having a 1,2-quinonediazide group; a is 1; b is an integer of 0 to 4; A is a single bond, a polymethylene group having 1 to 4 carbon atoms, a cycloalkylene group, a phenylene group, a group represented by the following formula (2):

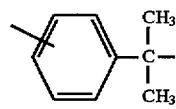 (2)

a carbonyl group, an ester group, an amide group or an ether group; Y is a hydrogen atom, an alkyl group or an aryl group; and $X^1$ and $X^2$ are the same or different and represented by the following formula (3):

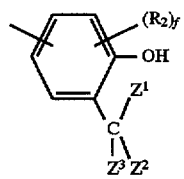 (3)

wherein each of $Z^1$, $Z^2$ and $Z^3$ is the same or different and is an alkyl group, a cycloalkyl group or an aryl group; $R^2$ is an alkyl group, a cycloalkyl group or an alkoxyl group; and f is an integer of 0 to 3.

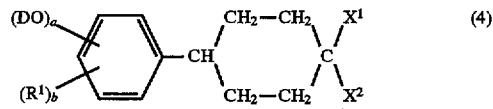 (4)

2. The radiation sensitive resin composition of claim 1, wherein the alkali soluble resin is selected from the group consisting of novolak resins, polyvinyl phenol and derivatives thereof, styrene-maleic anhydride copolymers and derivatives thereof, polyvinylhydroxy benzoate and carboxyl group-containing methacrylic acid-based resins.

3. The radiation sensitive resin composition of claim 1, wherein the alkali soluble resin is a novolak resin having a weight average molecular weight in terms of polystyrene of 2,000 to 20,000.

4. The radiation sensitive resin composition of claim 1, wherein the 1,2-quinonediazide compound has a 1,2-quinonediazide group selected from the group consisting of a 1,2-benzoquinonediazide-4-sulfonyl group, 1,2-naphthoquinonediazide-4-sulfonyl group, 1,2-naphthoquinonediazide-5-sulfonyl group and 1,2-naphthoquinonediazide-6-sulfonyl group.

5. The radiation sensitive resin composition of claim 1, which contains a 1,2-quinonediazide compound other than the 1,2-quinonediazide compound of the formula (1) in an amount of 5 to 50 parts by weight based on 100 parts by weight of the alkali soluble resin.

6. The radiation sensitive resin composition of claim 1, which further contains a compound selected from the group consisting of low-molecular weight phenol compounds, low-molecular weight novolak resins and low-molecular weight resol resins as a dissolution promoter.

7. The radiation sensitive resin composition of claim 6, which contains the dissolution promoter in an amount of 50 parts or less by weight based on 100 parts by weight of the alkali soluble resin.

8. The radiation sensitive composition of claim 1, wherein the 1,2-quinonediazide compound of the formula (1) is used in a proportion of 1 to 50 parts by weight based on 100 parts by weight of the alkali soluble resin.

9. The radiation sensitive composition of claim 1, wherein the 1,2-quinonediazide compound of the formula (1) is at least one compound selected from the group consisting of compounds represented by the following formula (11-22), (11-31), (11-39), (11-42), (11-53) and (11-57):

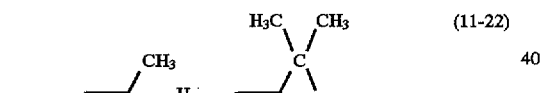
(11-22)

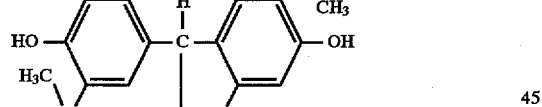
(11-31)

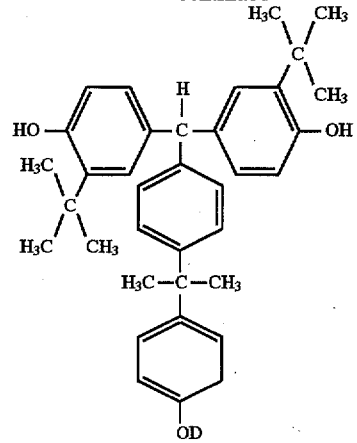
(11-39)

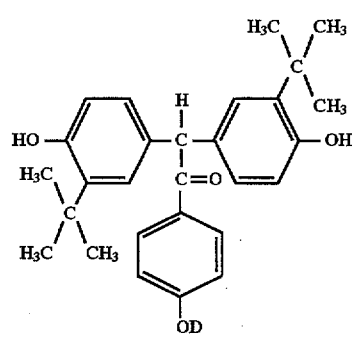
(11-42)

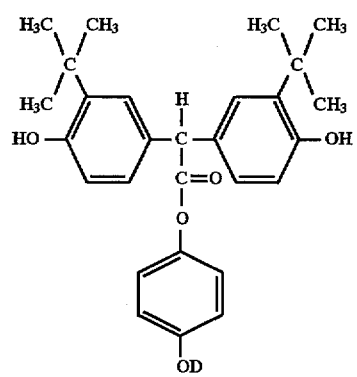
(11-53)

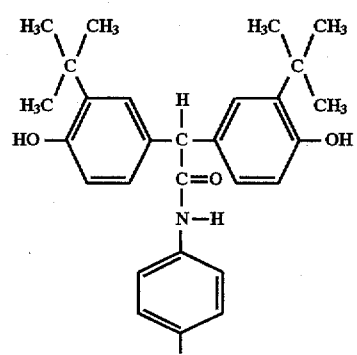
(11-57)

wherein D is an organic radical having a 1,2-quinonediazide group.

10. A radiation sensitive resin composition containing, in admixture, an alkali soluble resin and a radiational effective amount of at least one 1,2-quinonediazide compound selected from the group consisting of compounds represented by the following formula (4):

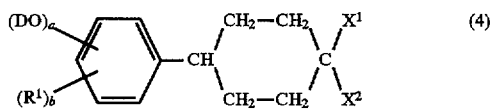

wherein R¹ is an alkyl group having 1 to 3 carbon atoms, a cycloalkyl group, an alkoxy group having 1 to 3 carbon atoms or an aryl group; D is an organic radical having a 1,2-quinonediazide group; a is 1; b is an integer of 0 to 4; and $X^1$ and $X^2$ are the same or different and represented by the following formula (3):

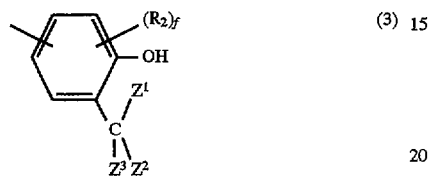

wherein each of $Z^1$, $Z^2$ and $Z^3$ is the same or different and is an alkyl group, a cycloalkyl group or an aryl group; $R^2$ is an alkyl group, a cycloalkyl group or an alkoxyl group; and f is an integer of 0 to 3.

11. The radiation sensitive resin composition of claim 10, wherein the alkali soluble resin is selected from the group consisting of novolak resins, polyvinyl phenol and derivatives thereof, styrene-maleic anhydride copolymers and derivatives thereof, polyvinylhydroxy benzoate and carboxyl group-containing methacrylic acid-based resins.

12. The radiation sensitive resin composition of claim 10, wherein the alkali soluble resin is a novolak resin having a weight average molecular weight in terms of polystyrene of 2,000 to 20,000.

13. The radiation sensitive resin composition of claim 10, wherein the 1,2-quinonediazide compound has a 1,2-quinonediazide group selected from the group consisting of a 1,2-benzoquinonediazide-4-sulfonyl group, 1,2-naphthoquinonediazide-4-sulfonyl group, 1,2-naphthoquinonediazide-5-sulfonyl group and 1,2-naphthoquinonediazide-6-sulfonyl group.

14. The radiation sensitive resin composition of claim 10, which further contains a 1,2-quinonediazide compound other than the 1,2-quinonediazide compound of the formula (4) in an amount of 5 to 50 parts by weight based on 100 parts by weight of the alkali soluble resin.

15. The radiation sensitive resin composition of claim 10, which further contains a compound selected from the group consisting of low-molecular weight phenol compounds, low-molecular weight novolak resins and low-molecular weight resol resins as a dissolution promoter.

16. The radiation sensitive resin composition of claim 15, which contains the dissolution promoter in an amount of 50 parts or less by weight based on 100 parts by weight of the alkali soluble resin.

17. The radiation sensitive composition of claim 10, wherein the 1,2-quinonediazide compound of the formula (4) is used in a proportion of 1 to 50 parts by weight based on 100 parts by weight of the alkali soluble resin.

18. The radiation sensitive composition of claim 10, wherein the 1,2-quinonediazide of the formula (4) is at least one compound selected from the group consisting of compounds represented by the following formula (11-46) and (11-47):

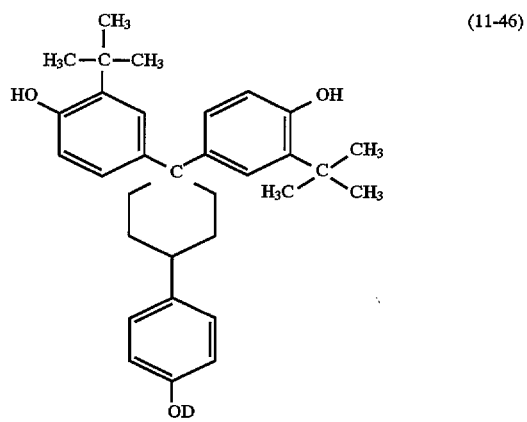

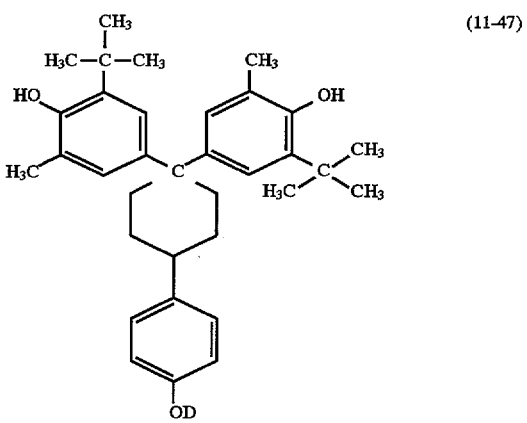

wherein D is an organic radical having a 1,2-quinonediazide group.

* * * * *